(12) United States Patent
Cowley et al.

(10) Patent No.: US 8,736,480 B1
(45) Date of Patent: May 27, 2014

(54) SUCCESSIVE APPROXIMATION ANALOG-TO-DIGITAL CONVERSION ARCHITECTURAL ARRANGEMENT FOR RECEIVERS

(71) Applicants: Nicholas P. Cowley, Wiltshire (GB); Isaac Ali, Bristol (GB); Viatcheslav I. Suetinov, Swindon (GB); Keith Pinson, Swindon (GB)

(72) Inventors: Nicholas P. Cowley, Wiltshire (GB); Isaac Ali, Bristol (GB); Viatcheslav I. Suetinov, Swindon (GB); Keith Pinson, Swindon (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/739,510

(22) Filed: Jan. 11, 2013

(51) Int. Cl.
*H03M 1/12* (2006.01)

(52) U.S. Cl.
USPC ............ 341/172; 341/118; 341/155; 341/136; 341/122; 341/140

(58) Field of Classification Search
USPC .................................................. 341/118–155
See application file for complete search history.

(56) References Cited

U.S. PATENT DOCUMENTS

| | | | | |
|---|---|---|---|---|
| 5,248,974 A | * | 9/1993 | Fattaruso et al. | 341/172 |
| 6,404,376 B1 | * | 6/2002 | Kalthoff et al. | 341/172 |
| 6,879,277 B1 | * | 4/2005 | Cai | 341/155 |
| 6,882,298 B2 | * | 4/2005 | Leung et al. | 341/172 |
| 6,914,550 B2 | * | 7/2005 | Cai | 341/155 |
| 8,471,751 B2 | * | 6/2013 | Wang | 341/156 |
| 2005/0078025 A1 | * | 4/2005 | Cai | 341/162 |
| 2005/0078026 A1 | * | 4/2005 | Cai | 341/162 |
| 2013/0002467 A1 | * | 1/2013 | Wang | 341/172 |
| 2013/0076553 A1 | * | 3/2013 | Kuo et al. | 341/172 |
| 2013/0088375 A1 | * | 4/2013 | Wu et al. | 341/120 |
| 2013/0099953 A1 | * | 4/2013 | Tsai et al. | 341/161 |

* cited by examiner

*Primary Examiner* — Lam T Mai
(74) *Attorney, Agent, or Firm* — Ellis B. Ramirez; Prass LLP

(57) ABSTRACT

An apparatus and method of successive approximation analog-to-digital conversion for receivers comprising that during a sample mode, connecting an array of capacitors to a plurality of sampling switches coupled to a plurality of amplified input signals, and during a conversion mode, connecting in common the array of capacitors to a comparator and isolating the array of capacitors from the plurality of sampling switches. Additionally, filtering is done by the summation of samples at phase offsets.

24 Claims, 9 Drawing Sheets

US 8,736,480 B1

SUCCESSIVE APPROXIMATION ANALOG-TO-DIGITAL CONVERSION ARCHITECTURAL ARRANGEMENT FOR RECEIVERS

BACKGROUND

Embodiment generally relate to electronic circuit designs, and more specifically to improvements in architectural arrangements which enable enhanced performance and/or features for sampling receivers, and specifically to direct conversion sampling receivers which include a successive approximation analog-to-digital converter (SAR-ADC) to enhance quality of sampling receivers, where the SAR-ADC incorporates a current redistribution digital-to-analog converter (DAC) and where filtering is implemented in the radio frequency (RF) domain by at least reusing a capacitor arrays which form all or part of the DAC within the SARADC.

Direct conversion sampling receivers are a relatively new realization and are highly suited to implementation on an ultra-high speed digital process since the receiver architecture eliminates the requirement for significant analogue circuits such as operational amplifier (op-amp) based continual time filters. However, current direct conversion receivers suffer from frequency spikes caused by aliasing components which may manifest around the s3*Flo range, where a Flo is 1 GHz. This pattern will be repeated for every 2*Flo increase in frequency offset and fundamentally relates to the harmonics of the sampling clock. Such decrease in the attenuation delivered by the sampled filter characteristic will lead to an increase in aliasing components, both noise and any discrete signals folding on to the desired channel. A further problem in conventional direct conversion receivers is that the characteristic response cannot be easily modified within the present architectural arrangement therefore there is no opportunity to adaptively modify the characteristic response in dependence on received signal conditions, i.e. to maximize attenuation at a given frequency.

Therefore, there is a need in the art for an architectural arrangement which substantially overcomes the aforementioned undesired characteristics.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
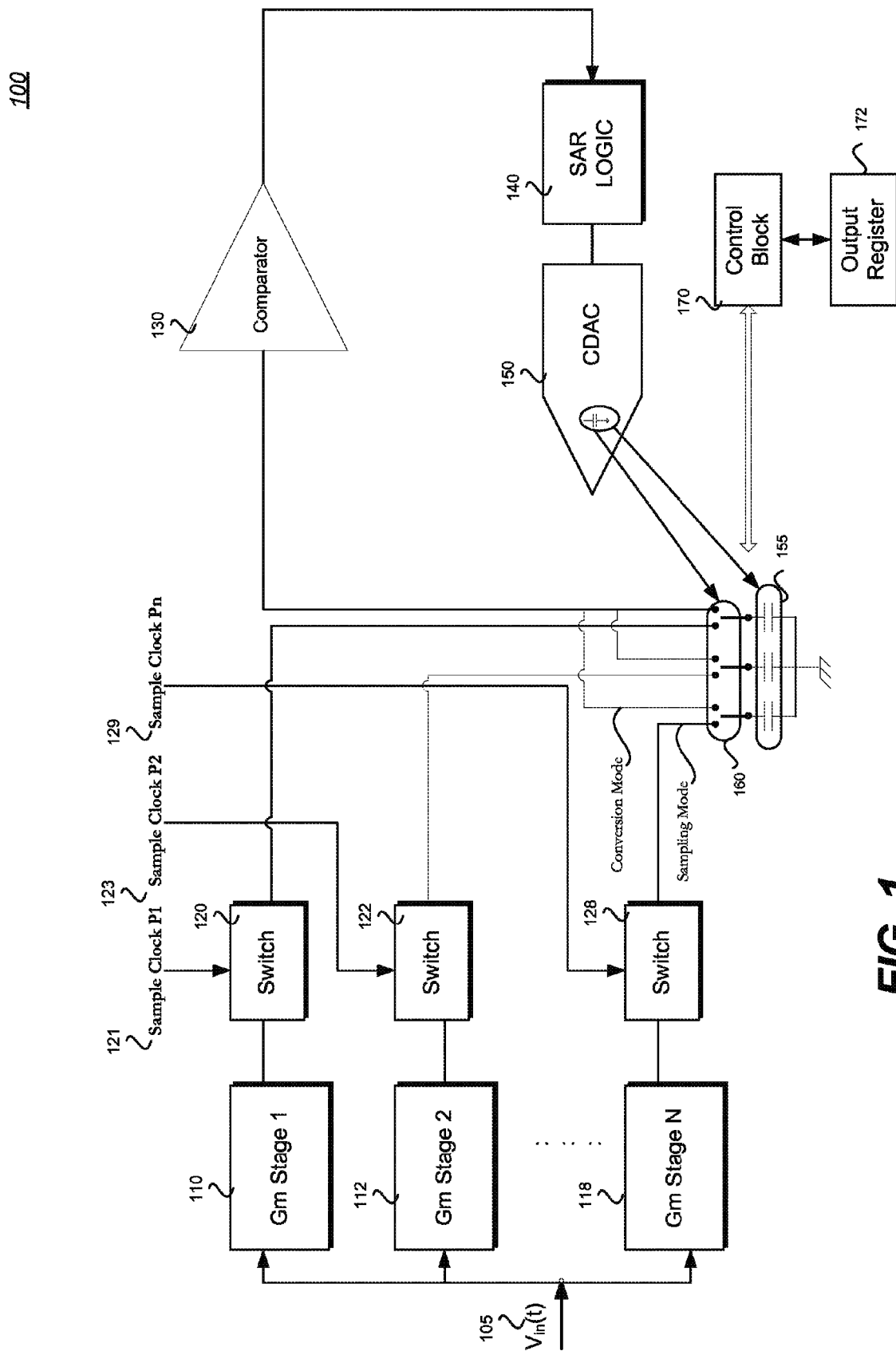
FIG. 1 is an illustration of a direct sampling receiver having charge redistribution SAR-ADC architecture with capacitor segment redeployment and two modes of operation (i.e., a sampling mode and a conversion mode) in accordance to an embodiment.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present inventions.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations. The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

FIG. 1 is an illustration of a direct sampling receiver having charge redistribution SAR-ADC architecture with capacitor segment redeployment and two modes of operation (i.e., a sampling mode and a conversion mode) in accordance to an embodiment. FIG. 1 is a diagram of a direct sampling receiver (DSR) 100 with charge redistribution SAR ADC implemented to process received signals 105 such as signal $V_{in}(t)$. DSR 100 is shown containing charge redistribution DAC (CDAC 150) and SAR logic 140. For clarity, power supplies (positive Vdd, negative Vee), as well as ground connections, are assumed to be present, but not shown in the Figure. CDAC 150 is shown associated with comparator 130, capacitor banks or array of capacitors 155, mode switches 160 each coupled to a capacitor in the array of capacitors, and sampling switches 120-128 where each sampling switch is associated with one element of a low noise amplifier (LNA) and one element of the array of capacitors. An input of comparator 130 is coupled to a reference voltage Vref. The closing or opening of each of the mode switches 160 is controlled by control block 170. The closing or opening of each of the sampling switches 120-128 is controlled by a sampling clock signal to selectively activate the sampling switches. The sampling clock signal may be externally generated, generated by control block 170, or by a programmed multivibrator in DSR 100. The sampling clock signals are used to activate the sampling switches as shown by sample clock P1 121 to activate sample switch 120; sample clock P2 123 to activate sample switch 122; and sample clock Pn 129 to activate sample switch 128. An input signal is split into N parallel segments, where N≥22, and each segment has an independent associated gain stage (Gm) (110, 112, ... 118) that is associated with a sample switch (120, 122, ... 128) which in turn is associated with a capacitor in the array of capacitors.

This arrangement allows for independent setting of all critical parameters for each of the N parallel segments (paths) without any one path interfering with any other path; i.e., each Gm stage (gm) can be independently set, the frequency and/or phase and/or mark space ratio of each sampling clock signal can be independently set, the capacitor segment selected from the array of capacitors that is redeployed to each path output (Sample switch) can be independently set.

A control block 170 based on the stored instructions relating to parameters such as the number of samples that correspond to a predetermined resolution, determines the switching of switch 160. The opening and closing of the switch is primarily determined by the number of samples from sample switch 120 which sets the sampling phase duration, and the number of cycles required to run the logic to switch the charge redistribution digital-to-analog converter (CRDAC) output. Switch 160 is controlled to two distinct configurations or phases. These configurations are (a) a sampling mode configuration and (b) a conversion mode configuration.

In the first configuration, referred to as the sampling mode/phase, the CDAC 150 charge redistribution array of capacitors 155 are connected to the output of the sampling switches (120, 122, ... 128) to integrate the current output sampled by the sampling switches; each capacitor in the array of capacitors is normally discharged before this period. After sampling the N capacitor segments are then recombined and operated in the same manner as conventional successive approximation analog-to-digital converters.

In the second configuration, referred to as the conversion mode/phase, After the requisite number of samples the DAC array of capacitors is then isolated from the input sampling switches and transitioned back to normal charge distribution function within the SAR-ADC wherein the array of capacitors are switched between supply voltage (Vdd) and ground (Vss) which redistributes the stored charge between the elements such that the resultant voltage on the capacitor is V=Q/C trends towards the reference voltage of the comparator 130. The output of comparator 130 then processed through quantization loop of SAR logic 140 and CDAC 150 until the number of iterations is produced and a predetermined resolution. Since the illustrated architecture is based on charge sampling and redistribution around the SAR-ADC capacitors the performance can be enhanced by redistribution of the capacitors and amplifiers (gm) during the sampling phase. The segments can be combined to perform harmonic attenuation like shown in FIG. 6 and to perform filtering like shown in FIG. 7.

Figure 2:
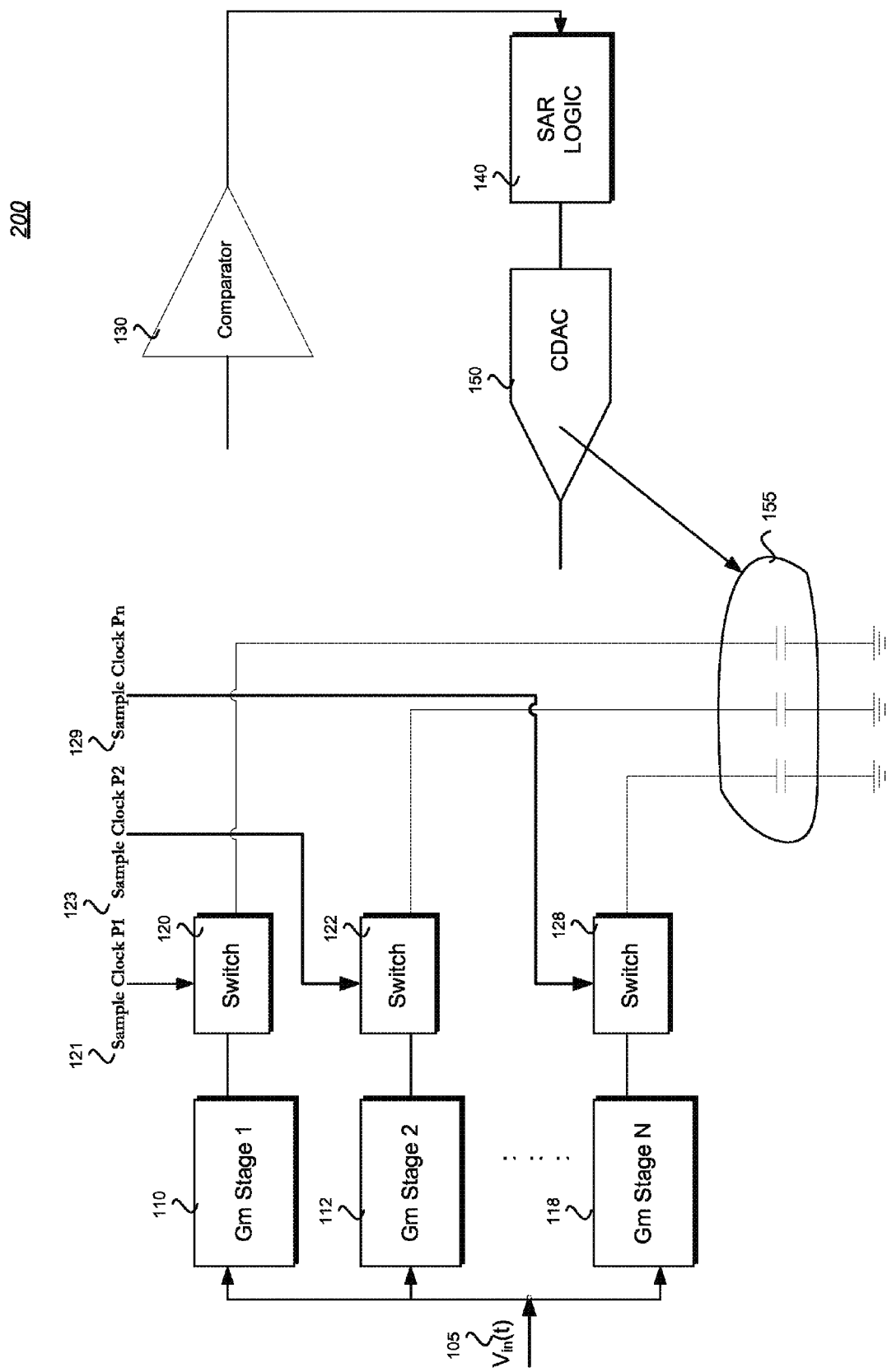
FIG. 2 is an illustration of a charge redistribution SAR-ADC architecture during a sampling phase in accordance to an embodiment.

FIG. 2 is an illustration of a charge redistribution SAR-ADC architecture during a sampling phase 200 in accordance to an embodiment. During the sampling mode as selected through mode switch 160 as explained in FIG. 1 one (1) or more samples of the input are passed to the array of capacitors by activating the sampling clock signal. As illustrated the mode switch 160 is set to the sampling mode and the capacitors in the array of capacitors are coupled to a plurality of sampling switches that are coupled to a plurality of amplified input signals. In this switch position (mode) the only obstacle to the charging of the array of capacitors is the state of the sampling switches (120, ... 128). Each sampling switch can be set to select a capacitor segment from the array of capacitors allowing the signal (sample) from the selected Gm stage to charge the capacitor.

Figure 3:
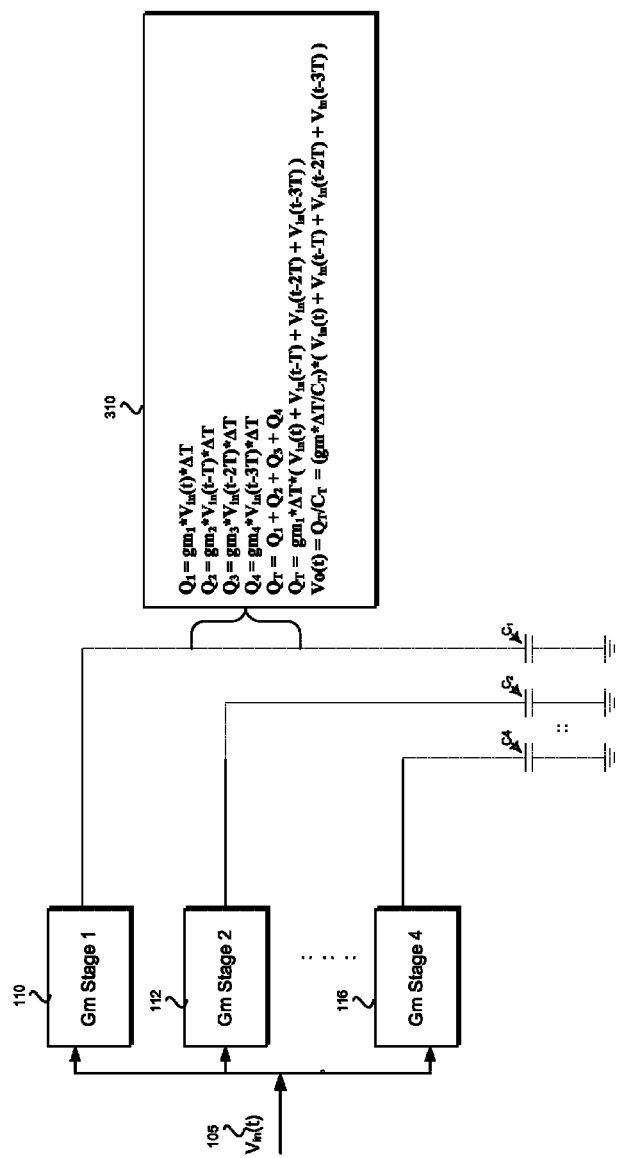
FIG. 3 is an illustration of a derivation of independent sampling during a sampling phase in accordance to an embodiment.

FIG. 3 is an illustration of a derivation of independent sampling during a sampling phase in accordance to an embodiment. FIG. 3 illustrates mathematically 310 the gain for each segment. The gain for each segment is simply the gain (gm) times (*) the total impedance $gm*Z_{Ctotal}$, where Ctotal is the total capacitance such as $C_1$, $C_2$, and $C_4$. The actual segment capacitor value has no influence on the gain and hence contribution from each segment since the charge stored during sampling phase on the independent segments are redistributed to the total capacitance before conversion phase.

Figure 4:
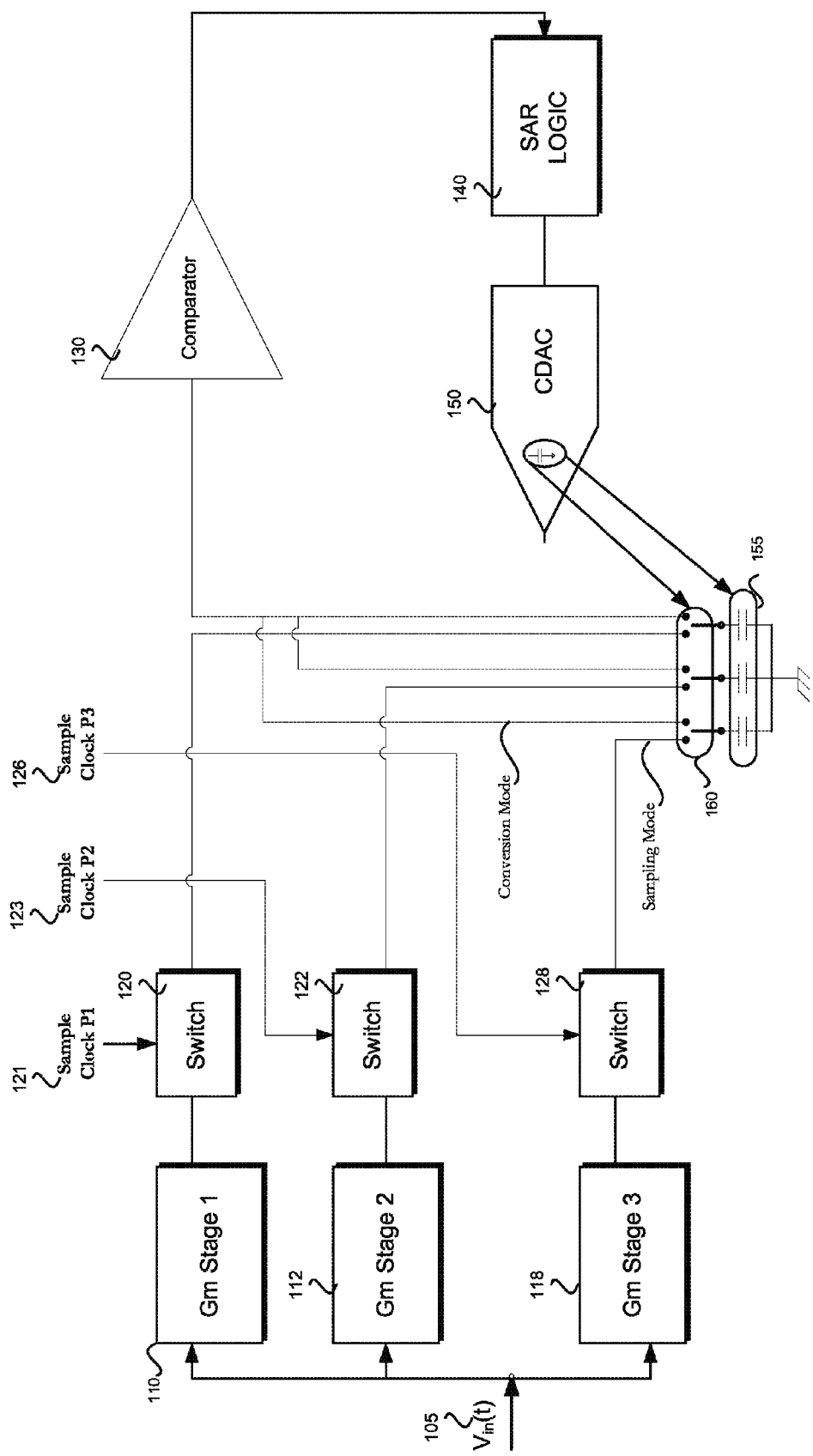
FIG. 4 is an illustration of the direct sampling receiver with SAR-ADC architecture of FIG. 1 modified with only three gm stages in accordance to an embodiment.

FIG. 4 is an illustration of the direct sampling receiver with SAR-ADC architecture of FIG. 1 modified with only three gm stages in accordance to an embodiment. With reference to FIG. 4 the front end gm stage contains three parallel gm stages, i.e., Gm Stage1 110, Gm Stage2 112, and Gm Stage3 118. Each gin stage has an associated output switch (120, 122, 128) with sampling clock signal like Sample ClockP1 121, Sample ClockP2 123 and Sample ClockP3 126 of phase relationship −45 0 and 45 degrees respectively. The capacitor ratio may be for example deployed with most significant bits (MSB) capacitor to segment 2 (Gm stage2 and sampling switch 122), "MSB-1" capacitor to segment 1 and the remaining capacitance to segment 3, which would be a simple switching arrangement; the ratios however are not limited to this arrangement and other more complex arrangements could be deployed whereby the capacitor ratios approximate more closely to the inverse of the gin ratios, such that the amplitude on each segment are substantially equal during the sampling phase.

Each Gm Stage contributes to the overall filter characteristic based upon the amplitude, duration (mark space ratio) and phasing of the individual sample of the input signal 105, referred to as the weight of each sample. There are a number of ways this can be implemented. One example, with reference to FIG. 1, is the 1 through N gm stages (110,112 ... 118) could be configured to provide a small number of different weights of the input signal. The required sample weight is then selected either by activating the associated switch or group of switches. In FIG. 4 the gin ratios for stage1, stage2 and stage3 are set to 1, $\sqrt{2}$, 1 respectively and offset in phase to each other.

Other configurations and weights are possible. For example, a system deploying eight (8) samples per cycle is shown in Table 1 for an architecture with each weight being provided by a separate gm/switch and in Table 2 for an architecture where the weights are constructed by two gm/switches of equal amplitude.

TABLE 1

(One switch per Gm stage)

| Gm weight | Sample | | | | | | | |
|---|---|---|---|---|---|---|---|---|
| | 1 | 2 | 3 | 4 | 5 | 6 | 7 | 8 |
| 0.5 | on | on | on | off | off | on | on | on |
| 1 | off | off | off | on | on | off | off | off |
| Total sample weight | 1 | 0.5 | 0.5 | 0.5 | 0.5 | 0.5 | 0.5 | 1.0 |

TABLE 2

(Two switches per Gm stage)

| Gm weight | Sample | | | | | | | |
|---|---|---|---|---|---|---|---|---|
| | 1 | 2 | 3 | 4 | 5 | 6 | 7 | 8 |
| 0.5 | on | on | on | on | on | on | on | on |
| 0.5 | off | off | off | on | on | off | off | off |
| Total sample weight | 1 | 0.5 | 0.5 | 0.5 | 0.5 | 0.5 | 0.5 | 1.0 |

Both these options provide the same resultant weight per sample of 1 unit for $1^{st}$ and $8^{th}$ samples and 0.5 unit for all others. The first option (Table 1) may be simpler to implement however the second option (Table 2) offers a greater degree of flexibility, for example if 3 gm/switches are provided the first option only offers three weights whereas the second option offers 8, so allowing a greater degree of flexibility in the implemented characteristic.

Figure 5:
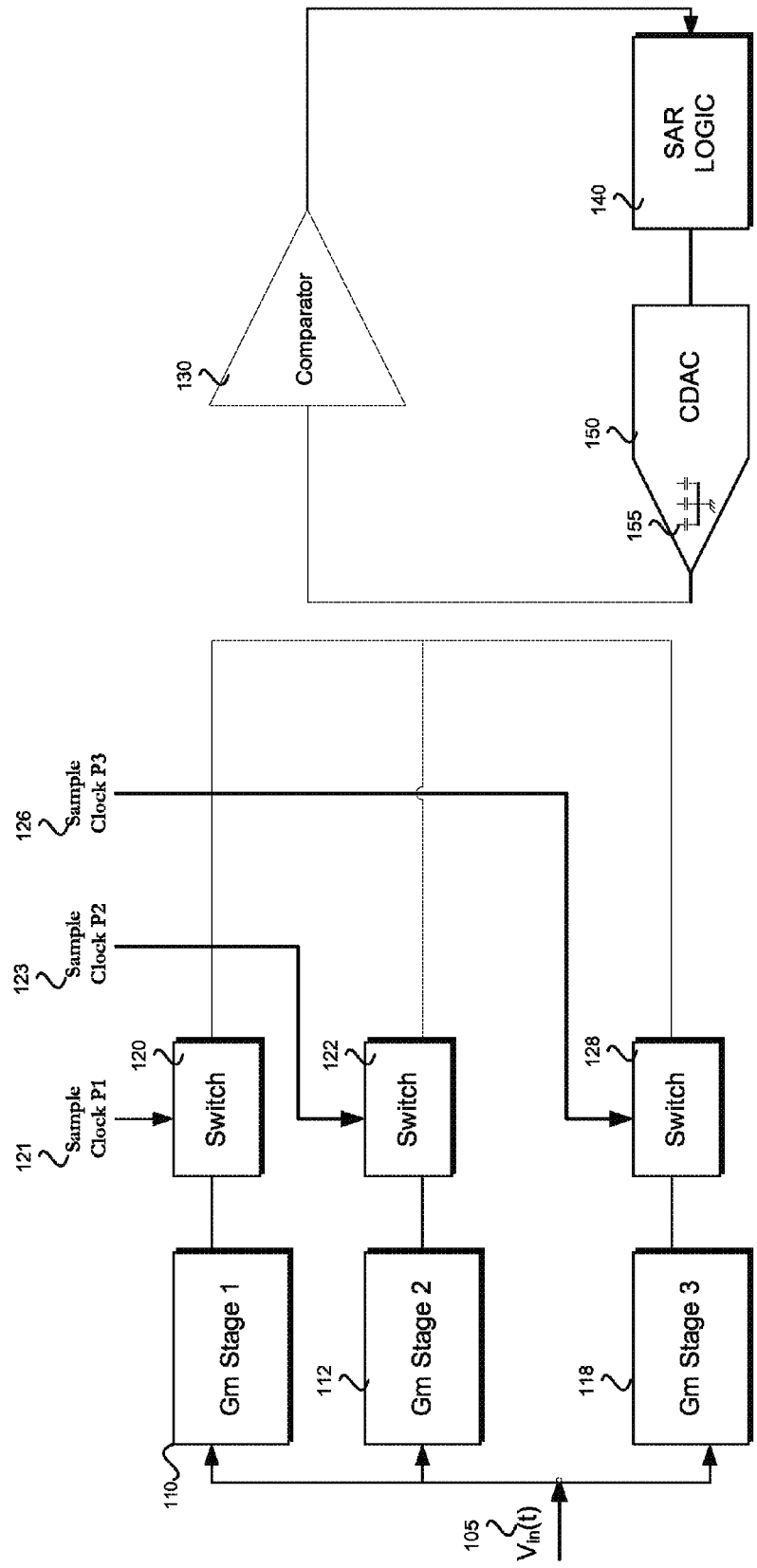
FIG. 5 is an illustration of the charge redistribution SAR-ADC architecture during a conversion phase in accordance to an embodiment.

FIG. 5 is an illustration of the charge redistribution SAR-ADC architecture during a conversion phase in accordance to an embodiment. In the conversion phase the array of capacitors 155 is shown isolated from the sampling switches (120, 122, . . . 128) and shorted together and transitioned back to normal charge distribution function within the SAR-ADC. The capacitors in the array of capacitors are switched between supply voltage (Vdd) and ground (Vss) which redistributes the stored charge between the elements such that the resultant voltage on the capacitor is V=Q/C trends towards a voltage and by connecting in common the array of capacitors to the input of comparator 130 where it is compared to a reference voltage for K clock cycles. A resulting code of a digital approximation of the sampled input voltage Vin (t) 105 can be outputted at the end of a conversion to output register 172. Also register 172 can supply an approximate digital code of the input voltage Vin(t) 105 to internal CDAC 150

Figure 6:
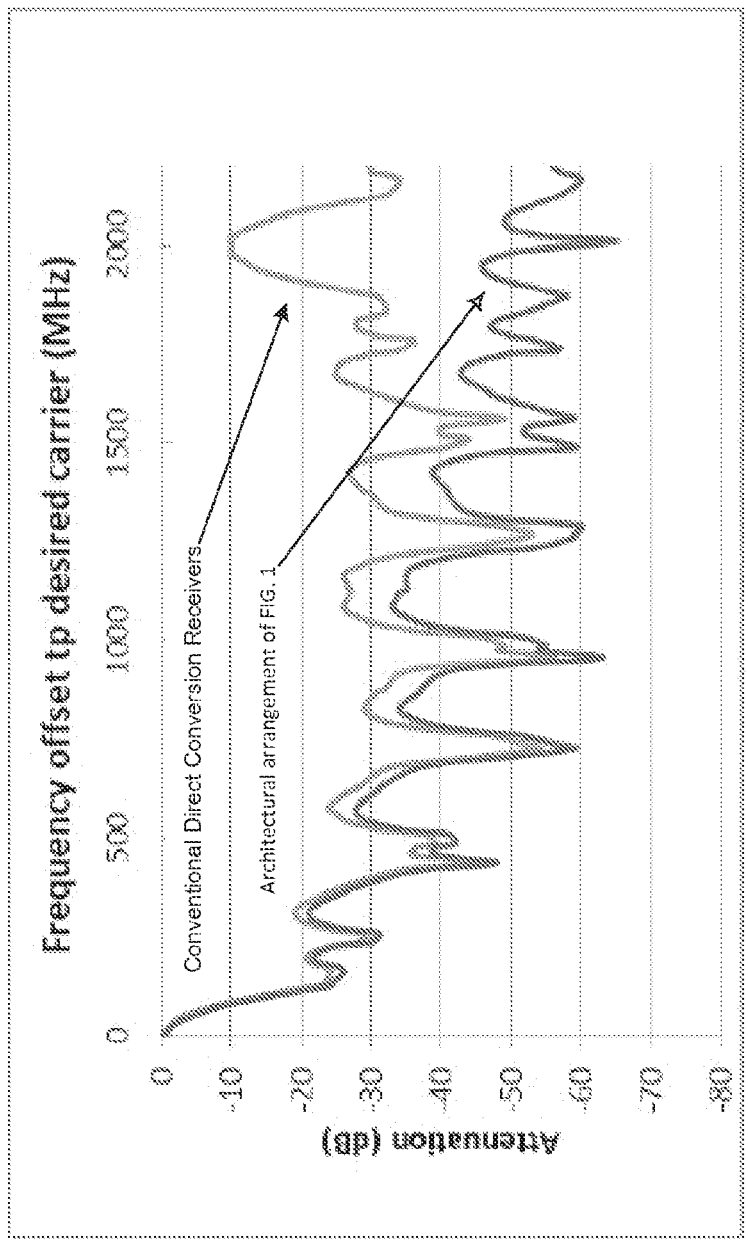
FIG. 6 is a comparison of attenuation at different frequencies between the direct sampling receiver with SAR-ADC architecture of FIG. 1 and conventional direct conversion receivers.

FIG. 6 is a comparison of attenuation at different frequencies between the direct sampling receiver with SAR-ADC architecture of FIG. 1 and conventional direct conversion receivers. The performance advantage of this new configuration shown in FIG. 1 is illustrated in FIG. 6 by comparison with conventional direct sampling receiver. As can be seen the filtering afforded improves across the frequency spectrum, with significant benefit at the third harmonic frequency (in this example at an offset of 2000 MHz with the desired frequency of 1000 MHz) so offering an improved rejection of aliasing components in a receiver implementing this configuration. That is because at the third and fifth harmonic the summation from the three segments like shown in FIG. 4 equal zero but contributions from all three segments are substantially added constructively at the fundamental frequency. Other configurations with additional segments can be implemented which also offer improvement at $7^{th}$ and 9th harmonics and the like.

Figure 7:
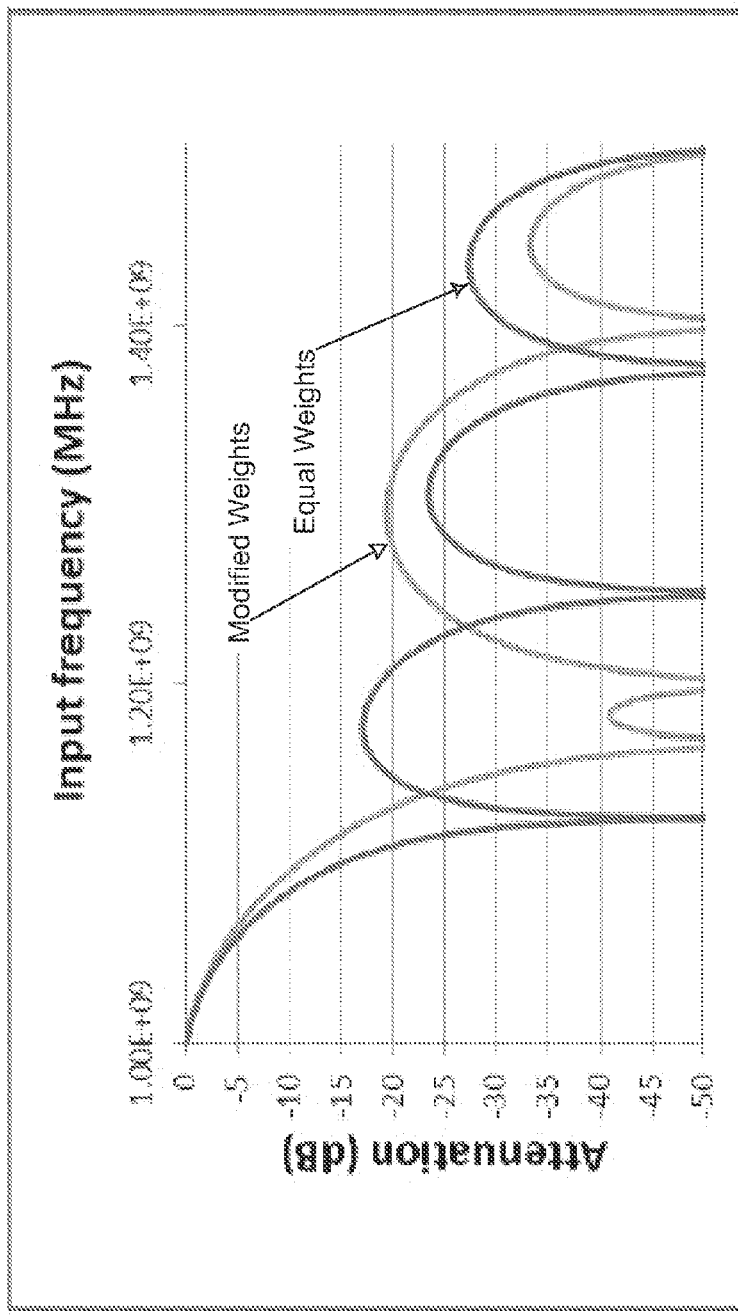
FIG. 7 is a comparison of filter characteristic for example weighted filter and prior art fixed weights filters used in direct conversion.

FIG. 7 is a comparison of filter characteristic for example weighted filter and prior art fixed weights filters used in direct conversion. As can be seen by modifying the weights the filter notch has been both shifted in frequency and widened. This is particularly advantageous in systems where it is desirable to suppress blocking signals which may lie at a different frequency to the notches present in an equal weighted filter or where the blocking signal may vary. In the latter case this architecture will allow the notch to be adjusted in dependence on the actual offset frequency of the blocker.

Figures 8A, 8B, 8C:
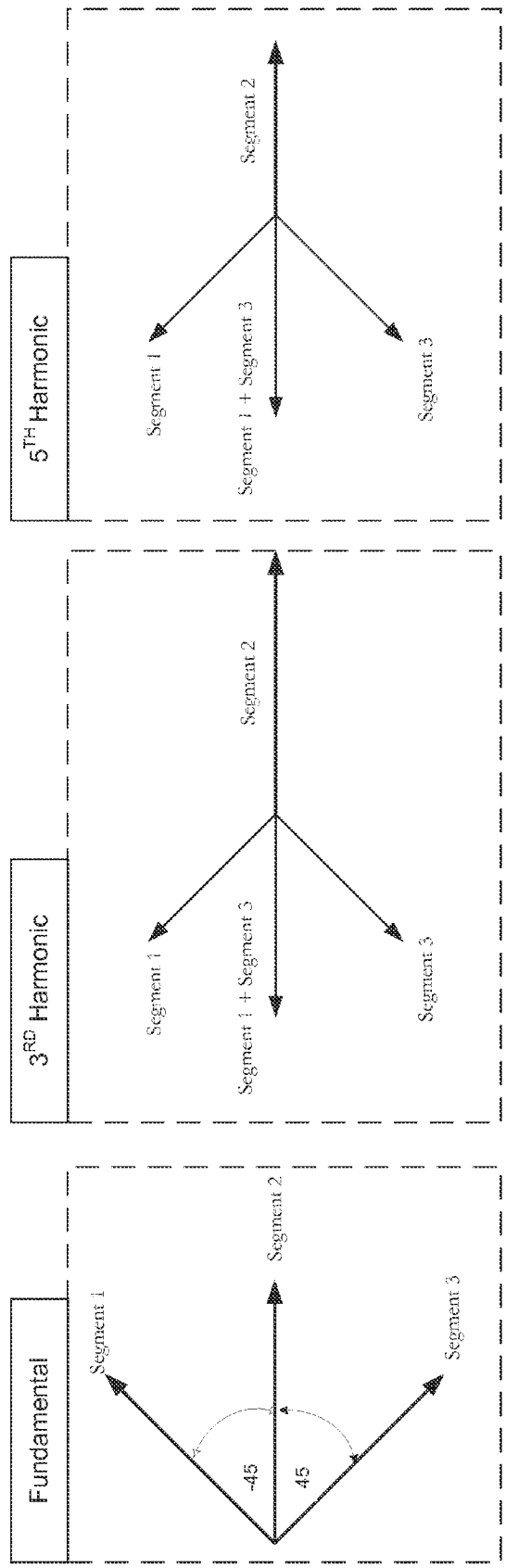
FIGS. 8A-8C illustrates the vector relationship for fundamental and harmonics of sampling clock signals in accordance to an embodiment.

FIGS. 8A-8C illustrates the vector relationship for fundamental and harmonics of sampling clock signal in accordance to an embodiment. FIG. 8A is a vector diagram of samples from the three segment arrangement shown in FIG. 4. The sampled vectors are phase offset (0, −45, and 45) and the sum of segment 1 and segment 3 is in phase with segment 2 so leading to constructive addition and a maximum amplitude in phase with segment 2. FIGS. 8B-8C show how the sum vector can be rotated and reduced in amplitude with increasing sampling frequency. FIG. 8b shows how combining sample1 and sample3 for the three segment vectors equal zero where they constructively add for the fundamental like shown in FIG. 8A. In FIG. 8B since the frequency is 3 times higher the vector phase angles are three times greater, so for segment 3 45 degrees rotates to 135 degrees and sector 1 at 315 rotates to 945 degrees or 135 degrees counter rotation. Now since the weights of the vectors are 1:√2:1 segments 1 and 3 add to create a vector at 180 degrees rotation of amplitude √2 which cancels with segment 2.

FIG. 8C shows the same response in the $5^{TH}$ harmonic and how filtering by summing the positive and negative charge packets can be combined to add (coherent) and subtract (destructive) to achieve RF filtering. Like the 3RD harmonic since the frequency is 5 times higher the vector phase angles are five times greater, so for segment 3 45 degrees rotates to 225 degrees and sector 1 at 315 rotates to 1575 degrees or 225 degrees counter rotation. Now since the weights of the vectors are 1:√2:1 segments 1 and 3 add to create a vector at 180 degrees rotation of amplitude √2 which cancels with segment 2. While some harmonics are illustrated other configurations with additional segments can be implemented which also offer improvements at $5^{th}$ and $7^{th}$ harmonics and the like.

Figure 9:
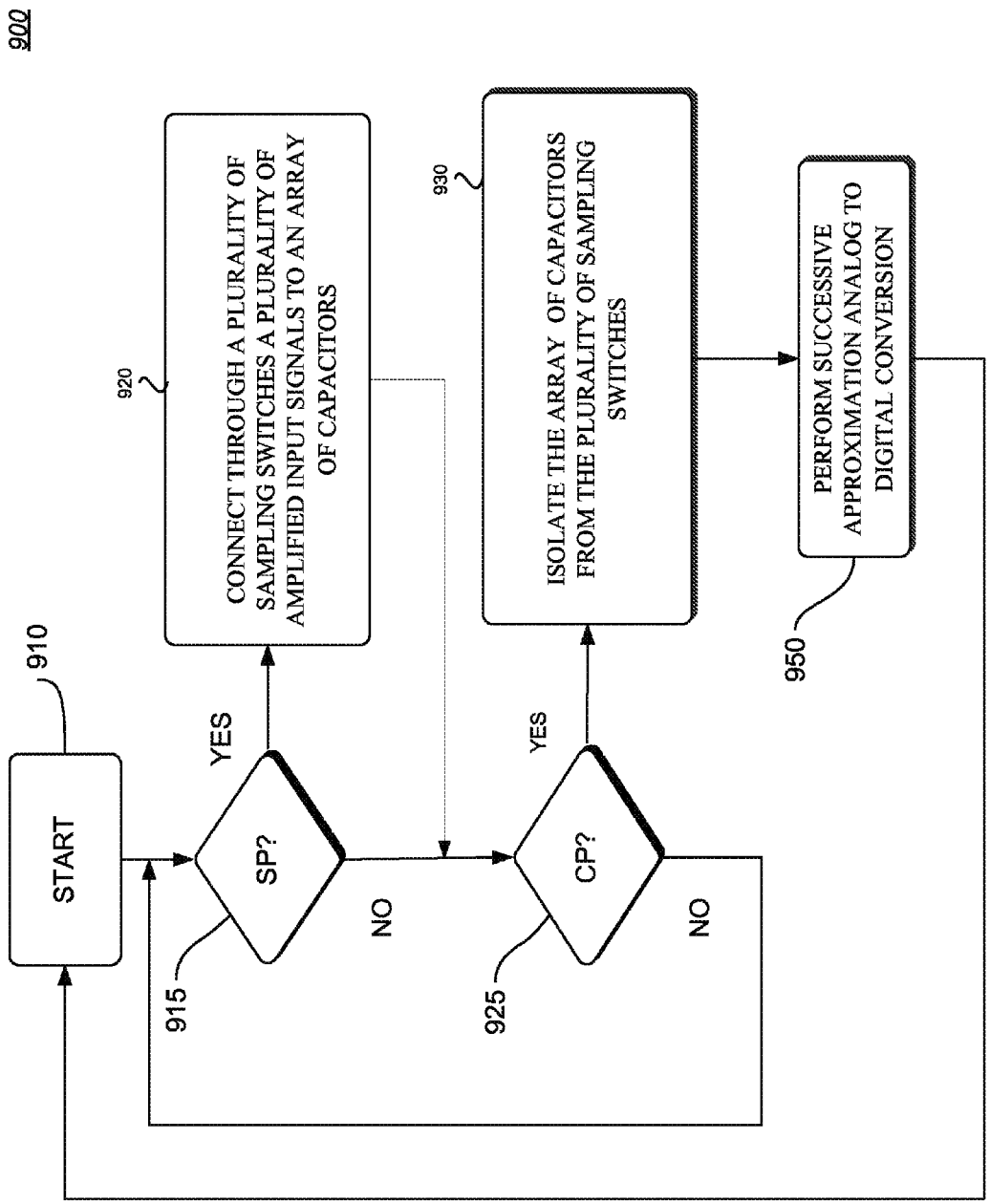
FIG. 9 is a flow diagram illustrating actions in a method for performing analog to digital conversion based on the architecture of FIG. 1 according to an embodiment.

FIG. 9 is a flow diagram illustrating actions in a method 900 for performing analog to digital conversion based on the architecture of FIG. 1 according to an embodiment. Method 900 begins with start 910. Control is then passed to action 915. Action 915 is implemented by positioning the mode switch 160 to the sampling mode. If the sampling mode has been selected then control is passed to action 920 for further processing in accordance to a sampling process. In action 920, connecting an array of capacitors to a plurality of sampling switches coupled to a plurality of amplified input signals. During action 920 (sampling period), the DAC charge redistribution capacitor is segmented into N independent capacitors and each segment then switched to the output of one of the sampling switches and so independent of other segments integrates the current output sampled by that switch. After action 920 control is passed to action 925. In action 925 if switch 160 is in the conversion mode then control is passed to action 930 for further processing. If switch 160 is not set to conversion mode then control is passed to action 915 for further processing. When control is passed to action 930 the array of capacitors 155 is isolated from the array of capacitors 155 and the capacitors are discharged through comparator 130. Control is then passed to action 950 where SAR-ADC is performed on the charges (Q) in the array of capacitors. After a predetermined number of iterations control is then passed to action 910.

The techniques described herein may be embodied in a computer-readable medium for configuring a computing system to execute the method. The computer readable media may include, for example and without limitation, any number of the following: magnetic storage media including disk and tape storage media; optical storage media such as compact disk media (e.g., CDROM, CDR, and the like) and digital video disk storage media; holographic memory; nonvolatile memory storage media including semiconductor-based memory units such as FLASH memory, EEPROM, EPROM, ROM; ferromagnetic digital memories; volatile storage media including registers, buffers or caches, main memory, RAM, and the like; and data transmission media including permanent and intermittent computer networks, point-to-point telecommunication equipment, carrier wave transmission media, the Internet, just to name a few. Other new and various types of computer-readable media may be used to store and/or transmit the software modules discussed herein. Computing systems may be found in many forms including but not limited to mainframes, minicomputers, servers, workstations, personal computers, notepads, personal digital assistants, various wireless devices and embedded systems, just to name a few. A typical computing system includes at least one processing unit, associated memory and a number of input/output (I/O) devices. A computing system processes information according to a program and produces resultant output information via I/O devices.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, while certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

We claim:

1. A method of successive approximation analog to digital conversion, the method comprising:
   during a sampling mode, connecting an array of capacitors to a plurality of sampling switches coupled to a plurality of amplified input signals; and
   during a conversion mode, connecting in common the array of capacitors to a comparator and isolating the array of capacitors from the plurality of sampling switches.

2. The method in accordance to claim 1, wherein the plurality of amplified input signals are coupled to the array of capacitors in accordance with a sampling clock signal to selectively activate the sampling switches.

3. The method in accordance to claim 2, wherein sampling clock frequency, sampling clock phase, and sampling clock mark space ratio for each sampling clock signal can be independently set.

4. The method in accordance to claim 2, wherein gain for each input signal can be independently set.

5. The method in accordance to claim 2, wherein by selectively activating with the sampling clock signal some of the plurality of switches a capacitor in the array of capacitors can be independently selected.

6. The method in accordance to claim 5, wherein during the sampling mode further comprises charging the selected capacitor in the array of capacitors.

7. The method in accordance to claim 6, wherein in the conversion mode the comparator compares a voltage across the array of capacitors to a reference voltage for k clock cycles.

8. The method in accordance to claim 7, wherein during the conversion mode converting a first sampled signal to a digital output signal over a number of iterations through a quantization loop, wherein the number of iterations corresponds to a predetermined resolution.

9. An apparatus comprising:
   a comparator;
   an array of capacitors, each capacitor being coupled between a corresponding mode switch and a first input terminal of the comparator, and each being arranged to receive an amplified input signal during a sample phase; and
   a control circuitry arranged to control a plurality of mode switches such that a capacitor is coupled to a sampling switch coupled to an amplified input signal during the sample phase and isolated from the sampling switch during a conversion phase,
   wherein the apparatus is a successive approximation register (SAR) analog to digital converter (ADC).

10. The apparatus in accordance to claim 9, wherein during the sample phase a plurality of amplified input signals being coupled to the array of capacitors in accordance with a sampling clock signal to selectively activate the sampling switches.

11. The apparatus in accordance to claim 10, wherein sampling clock frequency, sampling clock phase, and sampling clock mark space ratio for each sampling clock signal can be independently set.

12. The apparatus in accordance to claim 10, wherein gain for each input signal can be independently set.

13. The apparatus in accordance to claim 10, wherein by selectively activating with the sampling clock signal some of the plurality of switches a capacitor in the array of capacitors can be independently selected.

14. The apparatus in accordance to claim 13, wherein during the sample phase further comprises charging the selected capacitor in the array of capacitors.

15. The apparatus in accordance to claim 14, wherein in the conversion phase the comparator compares a voltage across the array of capacitors to a reference voltage for K clock cycles.

16. The apparatus in accordance to claim 15, wherein the conversion phase further comprises converting a first sampled signal to a digital output signal over a number of iterations through a quantization loop, wherein the number of iterations corresponds to a predetermined resolution.

17. A circuit comprising:
   a comparator;
   an array of capacitors, each capacitor being coupled between a corresponding mode switch and a first input terminal of the comparator, and each being arranged to receive an amplified input signal during a sample phase; and a successive approximation analog-to-digital converter (SAR-ADC), to filter the input signal by summing samples at phase offsets after applying weights to some of the samples, and configurable to convert the amplified input signal into a digital representation using a binary search and outputting the digital representation to an output register.

18. The circuit in accordance to claim 17, wherein the plurality of amplified input signals are coupled to the array of capacitors in accordance with a sampling clock signal to selectively activate the sampling switches.

19. The circuit in accordance to claim 18, wherein sampling clock frequency, sampling clock phase, and sampling clock mark space ratio for each sampling clock signal can be independently set.

20. The circuit in accordance to claim 18, wherein gain for the at least one amplifier can be independently set.

21. The circuit in accordance to claim 18, wherein by selectively activating with the sampling clock signal some of the plurality of switches a capacitor in the array of capacitors can be independently selected.

22. The circuit in accordance to claim 21, wherein the sample mode further comprises charging the capacitor segment.

23. The circuit in accordance to claim 22, wherein in the conversion mode the comparator compares a voltage across the array of capacitors to a reference voltage for k clock cycles.

24. The circuit in accordance to claim 23, wherein the conversion phase further comprises converting a first sampled signal to a digital output signal over a number of iterations through a quantization loop, wherein the number of iterations corresponds to a resolution selected.

* * * * *